United States Patent
Lu

(10) Patent No.: US 10,451,686 B2
(45) Date of Patent: Oct. 22, 2019

(54) DUMMY BATTERY DEVICE AND METHOD FOR TESTING ELECTRONIC DEVICES

(71) Applicant: Telefonaktiebolaget LM Ericsson (publ), Stockholm (SE)

(72) Inventor: Shuo Lu, Pointe-Claire (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 226 days.

(21) Appl. No.: 15/546,505

(22) PCT Filed: Feb. 2, 2015

(86) PCT No.: PCT/IB2015/050799
§ 371 (c)(1),
(2) Date: Jul. 26, 2017

(87) PCT Pub. No.: WO2016/124973
PCT Pub. Date: Aug. 11, 2016

(65) Prior Publication Data
US 2018/0017633 A1    Jan. 18, 2018

(51) Int. Cl.
*G01R 31/40* (2014.01)
*H01M 6/50* (2006.01)

(52) U.S. Cl.
CPC .......... *G01R 31/40* (2013.01); *H01M 6/5027* (2013.01); *H01M 2220/30* (2013.01)

(58) Field of Classification Search
CPC ............. H01M 2/1038; H01M 2/1044; H01M 6/5027; H01M 2220/30; H01R 11/281; G01R 31/40

USPC .................................................... 324/764.01
See application file for complete search history.

(56) References Cited

U.S. PATENT DOCUMENTS

| 5,995,375 | A  | 11/1999 | Miyazawa et al. |
| 8,049,461 | B2 | 11/2011 | Yu |
| 2009/0153128 | A1 | 6/2009 | Yu |
| 2012/0126784 | A1 | 5/2012 | Liu et al. |

OTHER PUBLICATIONS

Intuigence, Figure 14, http://image.slidesharecdn.com/designandtestingforbetterpowerconsumptionandbatterylifeinsmartphones-110404172527-phpapp02/95/design-and-testing-for-better-power-consumption-and-battery-life-in-smartphones-25-728.jpg?cb=1301956683, 2011 Intuigence Group, 1 page.
International Search Report from corresponding application PCT/IB2015/050799.

*Primary Examiner* — Melissa J Koval
*Assistant Examiner* — Rahul Maini
(74) *Attorney, Agent, or Firm* — Sage Patent Group

(57) ABSTRACT

A dummy battery device for testing an electronic device having a battery cavity, which includes a connector, comprises: a main structure shaped and dimensioned so as to fit in the battery cavity of the electronic device; and a head structure configured to be detachably and moveably connected to the main structure, the head structure having contacts for electrically connecting the connector of the battery cavity once the main structure is received in the battery cavity of the of the electronic device, and cables extending therefrom, the cables being electrically connected to the contacts of the head structure.

16 Claims, 3 Drawing Sheets

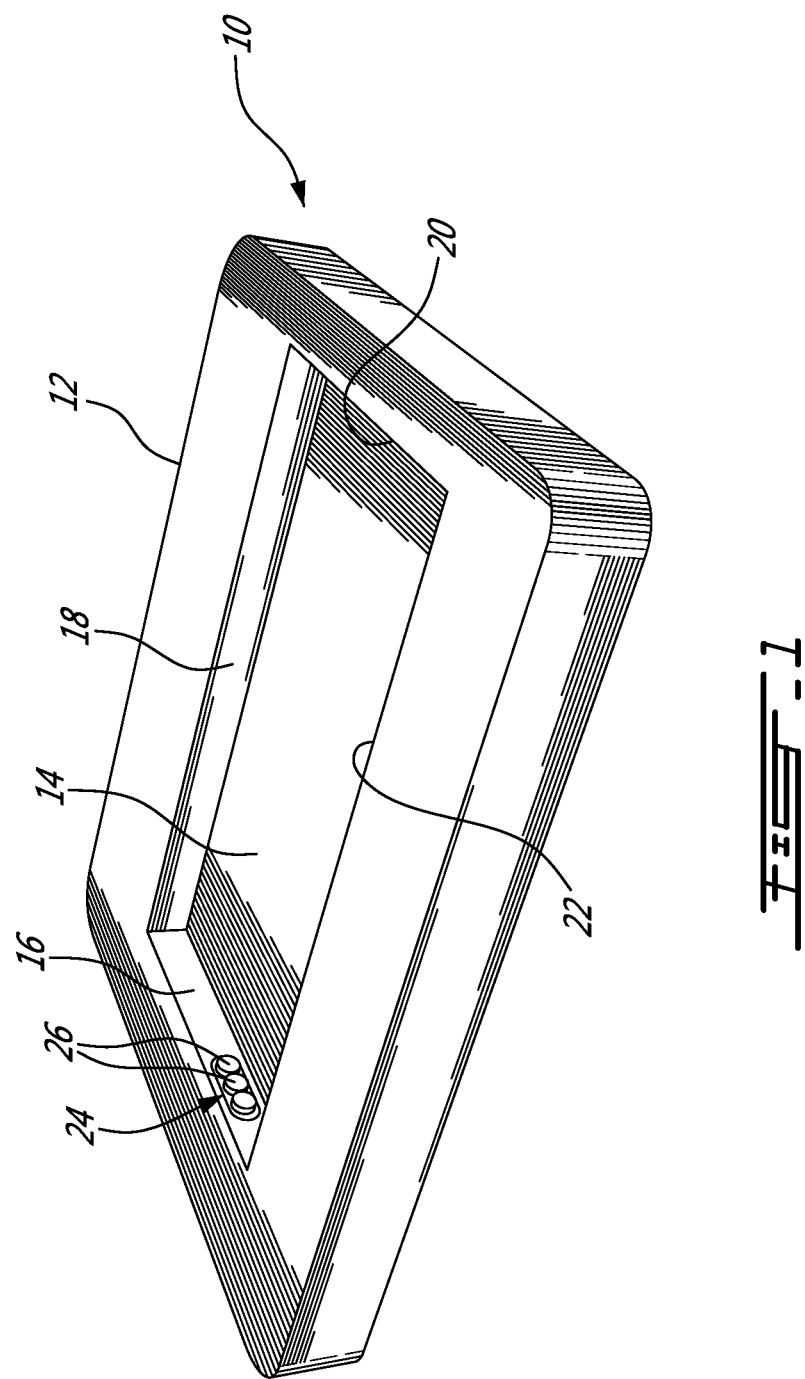

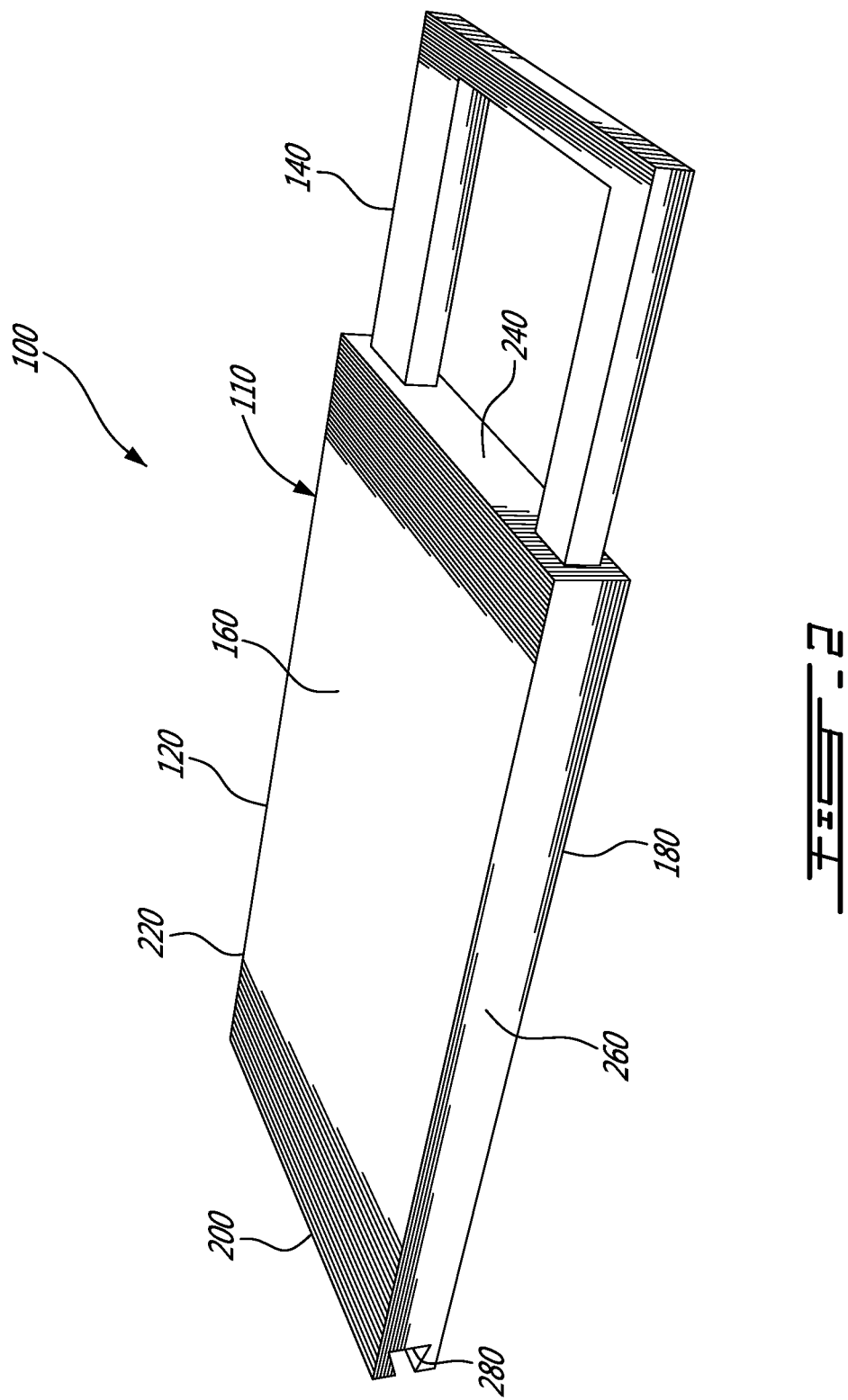

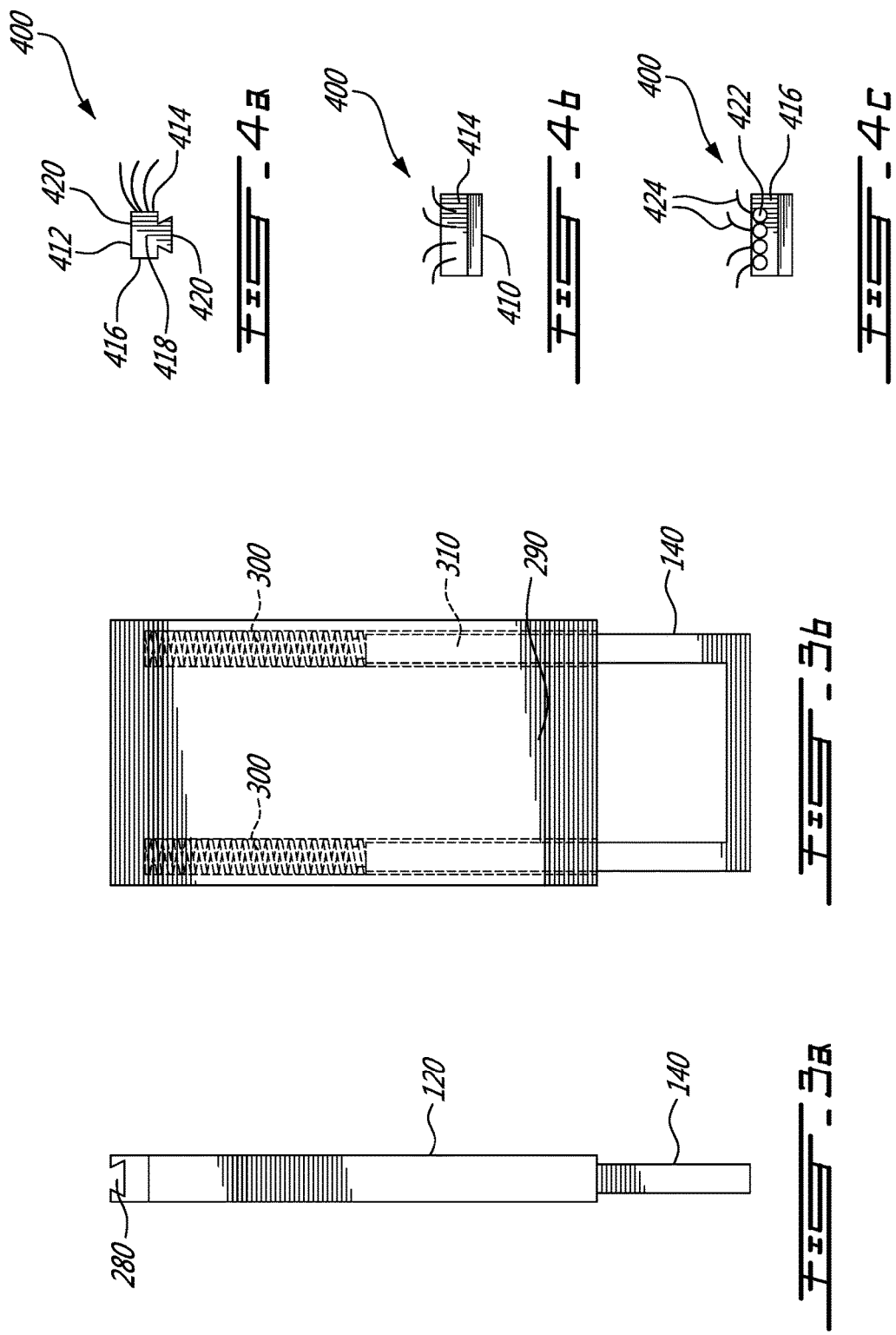

DUMMY BATTERY DEVICE AND METHOD FOR TESTING ELECTRONIC DEVICES

TECHNICAL FIELD

This disclosure relates generally to dummy batteries for testing electronic devices.

BACKGROUND

With the development of wireless communications and networks, user equipment and electronic devices and/or portable electronic devices, such as cellular phones or smartphones, are now in widespread use. Consumers may enjoy the full convenience of these high technology products almost anytime and anywhere.

For example, there are millions of smartphone applications that are available on the market. However, some of these applications may cause poor network performance, such as signaling storm, capacity outage, etc., and deteriorate customer experience, e.g. they can drain the battery unnecessarily or cause unexpected data usage.

Therefore, network operators, smartphone vendors and application developers are providing applications testing services in order to understand application behaviors and key performances. For example, application testing tools have been developed. These tools can test Key Performance Indicators (KPIs), such as traffic pattern, power consumption, functionality, security, stability, etc.

One of the challenges of the testing process is power consumption. During the testing process, the battery of the electronic device is required to be removed from the battery cavity of the electronic device. This is so because one needs to access the testing ports of the electronic device, if any, or the connectors for the battery. As a result of removing the battery, during the testing process, the electronic device has no power supplied by the original battery. However, the electronic device needs to be powered during the testing process.

Current solutions for testing smartphones use, for example, intrusive ways of soldering cables directly into the battery connectors in the smartphone body. These cables are then connected to a power supply to provide the electrical power. If one wishes to measure the power consumption of a smartphone running a particular application, a digital multi-meter can be used.

However, the current solutions have some issues and limitations. First, they require skills to solder cables into smartphones. The high temperature, and short circuits which are caused by poor contact, for example, can potentially damage the smartphones. Secondly, due to the difference in soldering skills of various engineers and technicians, and due to different cables and solder used, the electrical characteristics of the measurement setup are different. As such, the test results may not be consistent or even be invalid. Thirdly, manually soldering cables to battery contacts is time consuming and offers low efficiency.

Therefore, there is a need to improve the solutions for testing portable electronic devices such as smartphones.

SUMMARY

In one aspect of the invention, there is provided a dummy battery device for testing an electronic device having a battery cavity, which includes a connector. The dummy battery device comprises: a main structure shaped and dimensioned so as to fit in the battery cavity of the electronic device; and a head structure configured to be detachably and moveably connected to the main structure, the head structure having contacts for electrically connecting the connector of the battery cavity once the main structure is received in the battery cavity of the electronic device, and cables extending therefrom, the cables being electrically connected to the contacts of the head structure.

In another aspect of the invention, there is provided a method for testing a device having a removable battery cavity which includes a connector therein. The method comprises: connecting a dummy battery device to the connector in the cavity, the dummy battery device comprising: a main structure shaped and dimensioned so as to fit in the battery cavity of the electronic device; and a head structure configured to be detachably and moveably connected to the main structure, the head structure having contacts for electrically connecting the connector of the battery cavity once the main structure is received in the battery cavity of the portable electronic device, and cables extending therefrom, the cables being electrically connected to the contacts of the head structure; and connecting the cables extending from the head structure to at least one of a measurement device and power supply.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1 illustrates a schematic perspective view of an electronic device with a battery removed therefrom;

FIG. 2 illustrates a schematic perspective view of a dummy battery device according to an embodiment of the present invention;

FIG. 3 illustrates a see-through view of the dummy battery device of FIG. 2; and FIG. 4 illustrates different views of a detachable and moveable head structure, according to an embodiment of the present invention.

DETAILED DESCRIPTION

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

It is understood that the term electronic device refers to any types and/or sizes of smartphones, but can also refer to other types of user equipment and/or electronic devices, such as tablets, e-readers, Global Positioning System (GPS) devices, MP3 players, etc. The terms portable electronic devices, electronic devices and smartphones and phones can be used interchangeably.

Since battery can greatly affect the user experience, more and more individuals, companies, labs and network operators are using their own equipment to test the power consumption of applications running on smartphones. Due to the nature of various phone sizes and types of battery used, there is no universal dummy battery on the market that offers the feature of "one size fits all".

Generally speaking, embodiments of the present invention provide for a universal dummy battery device that can be used for testing smartphones. More specifically, the dummy battery device is designed in such a way that it can fit most of the smartphones with removable batteries. It has the features of "plug-n-play" and "one size fits all", which allow the dummy battery device to be easily installed in a smartphone battery cavity. Also, there is no soldering involved and is thus risk-free in terms of damages caused by poor soldering skills.

FIG. 1 illustrates a smartphone 10, having a main body 12. The main body 12 has a cavity 14 defined therein, to receive a battery (not shown). The cavity 14 has a first sidewall 16, a second sidewall 18, a third sidewall 20 and a fourth sidewall 22, together forming the cavity 14. The cavity 14 includes a connector 24, which can be placed on any of the four sidewalls, depending on the type of smartphones. The connector 24 may comprise 2, 3 or 4 contacts 26 depending on the types of smartphones. For example, FIG. 1 shows 3 contacts 26 which protrude from the sidewall 16 and are configured for electrically connecting with the battery (not shown) when the battery terminals (not shown) come in contact with them. The battery (not shown) is shaped and dimensioned to be received fittingly and detachably in the cavity 14. Once placed in the cavity 14, the battery supplies electrical power to the smartphone 10.

Now turning to FIG. 2, an embodiment of the universal dummy battery device will be described. The universal dummy battery device 100 has a main structure 110. The main structure 110 is shaped and dimensioned so as to fit inside the cavity 14 of the smartphone. More specifically, it is to be received fittingly and detachably in the cavity 14. Therefore, depending on the evolution of smartphones, the main structure 110 can take different forms and shapes in order to match the battery cavity of the smartphones.

The main structure 110 includes a main portion 120 and an adjustable portion 140.

The main portion 120 generally has a shape and size corresponding to that of a battery. As an example, the main portion 120 has a substantially rectangular frame having a top wall 160, a bottom wall 180 opposite of the top wall 160, and four sidewalls 200, 220, 240 and 260. The main portion 120 can be made of plastic, metal, or composite material with strong stiffness. The main portion 120 also has a cut out or a socket 280 in one of the four sidewalls, such as in sidewall 200.

The adjustable portion 140 can extend from any of the four sidewalls 200 to 260 of the rectangular frame of the main portion 120. However, the adjustable portion 140 should not preferably extend from a sidewall that corresponds to the sidewall of the battery cavity 14 which has the connector 24. For example, in FIG. 2, the adjustable portion 140 extends from sidewall 240, at the opposite of sidewall 200.

FIG. 3 shows a detailed see-through view of the adjustable portion 140. FIG. 3 shows that the main portion 120 may further comprise an interior chamber 290, extending inwardly from a sidewall (such as 240) of the main portion 120. The adjustable portion 140 partially resides within the chamber 290. More specifically, the adjustable portion 140 is slidingly received in the chamber 290. The adjustable portion 140 comprises springs 300, which are located within the chamber 290 and a bracket 310. The bracket 310 is attached to the springs 300 within the chamber 290 of the main portion 210. A first part of the bracket 310 extends outside the main portion 120 and a second part of the bracket 120 is located inside the main portion 120. There are several ways to attach the springs 300 to the bracket 310, as would be appreciated by persons skilled in the art. For example, one way to attach the bracket 310 to the springs 300 is as follows: the diameter of the bracket head is a little bit smaller than the diameter of the springs 300. Thus, the bracket end can enter into the springs 300, which surround the bracket head. This way is referred to as a detachable way between the springs 300 and the bracket 310, i.e. the bracket 310 and the springs 300 are detachably attached to each other. A second way, which is referred to as the undetachable way, is as follows: the diameter of the springs 300 is the same or similar as the diameter of the bracket 310. But a notch is provided around the bracket head; the notch is used to coil the end of the springs 300 around it. As a result, the bracket 310 is attached to the end of the springs 300 in a permanent manner. Different types of springs 300 can be used in the adjusting portion 140, for example, a compression coil spring can be used.

The springs 300 allow the dummy battery device 100 to adjust its length so as to be fitted into the battery cavity 14. More specifically, the springs 300 can be stretched or shortened (i.e. pushed) in order to make the dummy battery device 100 fit into the cavity 14 and to hold it firmly in place inside the battery cavity 14 of the smartphone. The bracket 310 of the adjustable portion 140 is shown as having a u-shaped piece supported by the springs 300. It should be noted that other shapes and configurations can be used, as will be appreciated by persons skilled in the art. For example, the bracket 310, instead of being u-shaped, could be represented by two guiding posts. Also, two individual springs could extend from one end of the main portion 120 to the other end and be used as part of the adjustable portion 140. The bracket 310 can be made of plastic, metal or composite material with strong stiffness.

The adjusting portion 140 allows the universal dummy battery device 100 to fit snugly, tightly, firmly and securely in the battery cavity 14 of a smartphone once it is received in the cavity 14. Also, it allows the universal dummy battery device to fit most smartphone battery cavities, which may vary in size and shape.

It should be understood that mechanisms, other than springs, can be used to adjust the length of the dummy battery device 100, as will be appreciated by persons skilled in the art. For example, as an alternative to the spring mechanism, a friction force mechanism could be used.

Now turning to FIG. 4, a detachable and moveable head structure 400 will be described.

In FIG. 4a) a side view of the detachable and moveable head structure 400 is given. In FIG. 4b) a rear view of the detachable and moveable head structure 400 is provided and in FIG. 4c) a front view of the detachable and moveable head structure 400 is given. The head structure 400 is configured to be detachably and moveably connected to the main structure 110, or more specifically, for connecting with the socket 280 of the main portion 120.

The detachable and moveable head structure 400 has a bottom surface 410, a top surface 412, a first side surface 414, a second side surface 416, opposite to the first surface 414, a third side surface 418 and a fourth side surface 420 opposite to the third surface 418. On the bottom surface 410, a projection 420 extends along the entire length of the detachable and moveable head 400. The projection 420 can enter the socket 280 on the main portion 120 of the dummy battery device 100 to provide for a dovetail joint mechanism.

When the projection 420 is received in the socket 280, the moveable and detachable head structure 400 is free to slide and move laterally but is blocked longitudinally.

By being able to move the head structure 400 along the length of the sidewall of the dummy battery device 100, it is possible to adjust the moveable head structure 400 to face battery contacts that may have different and variable positions depending on the types of smartphones.

Other mechanisms can be used, for providing a moveable and detachable head structure 400, as will be appreciated by a person skilled in the art. For example, if the sidewall 200 was made of iron material, then the bottom surface 410 of the head structure 400 could be provided with a magnet, so that the user can move the head structure 400 to variable positions on sidewall 200. Another mechanism could consider replacing the socket 280 by a track. In this case, the bottom surface 410 of the head structure 400 includes a screw. The user can fix the head structure 400 on the track by using a screw nut, for example.

It should be noted that the main structure 110 or more specifically the main portion 120) and the head structure 400 have a complementary joint mechanism. The socket 280 has been described as belonging to the main portion 120 and the projection 420 belonging to the head structure 400. However, the head structure 400 could have the socket and the main portion 120 have the projection. In the same way, the complementary join mechanism of magnet and iron material and the track and screw could be placed on either the main portion 120 or the head structure 400.

Furthermore, different mechanisms can be used to stop the moveable head structure 400 at variable positions on the sidewall 200, i.e. facing the connector 24. One example could be to use a magnet at the bottom surface 410. In this case, the socket 280 should be made out of iron material. This results in the moveable head structure 400 being able to stick to variable positions on the socket 280, but being still moveable (by hand, for example) when another position is needed. Another example is to use a needle. A needle like a probe can be installed on one end of the projection 420. Also, a button is provided on the top surface 412, which can control the probe to be in or out (to extend or not). When the probe is in (not extended), there is minimal friction force between the socket 280 and the moveable head structure 400 so that the moveable head structure 400 can freely move. When the probe is out (extended), the friction force will be large enough to make the moveable head structure 400 stop at a certain position and stay stable in that position when placed in the cavity 14.

Moreover, as shown in FIG. 4c), the moveable head structure 400 has four contacts 422 located on the sidewall 416. The contacts 422 are similar to those of most smartphone batteries. Also, there are four cables 424 coming out of the moveable head structure 400, each cable 424 being electrically connected to a contact 422. When the dummy battery device 100 is placed in the cavity 14 of the smartphone, the contacts 26 of the connector 24 are in electrical connection with the contacts 422 of the moveable head structure 400. Therefore, the cables 424 enable users to easily connect the battery connector 24 to measurement devices and power supply, when the dummy battery device 100 is placed in the cavity 14 of the smartphone. For example, the ends of the cables 424 have connectors for connecting to the measurement devices and/or power supply device. The length of the cables 424 may vary, but they should be long enough to allow easy connection with the measurement devices. For example, the cables can be 5 to 10 cm long. The size and length of the cables depend on the types of tests that need to be performed on the smartphones.

Most smartphones have 4 battery contacts in their connectors 24, but some of them have only 2 or 3. Whether the smartphones have 2, 3 or 4 battery contacts, the moveable head structure 400 of the dummy battery device 100 can be used for testing purposes for those smartphones.

It is very easy to use the dummy battery device 10 for testing purposes. For example, when someone wants to test the power consumption of a smartphone, he/she first removes the battery from the cavity of the smartphone. Then, he/she slides the moveable head structure 400 in the socket 280 of the dummy battery device 100 in a way that the contacts 422 on the head structure 400 will enter into contact with the connector 24 of the cavity 14, once the dummy battery device 100 is placed within the cavity 14. Then, he/she puts the dummy battery device 100 within the cavity 14 of the smartphone, by pressing the adjustable portion 140 of the dummy battery device 100. The strength generated by the springs 300 allows the dummy battery device 100 to be held firmly in the cavity 14. Once in place, the contacts 422 of the moveable head structure 400 are connected to the contacts 26 of the connector 24. The cables coming out of the head structure 400 are connected to the contacts 422. Thus, the user can use the cables to create a connection between the smartphone and the measurement devices. Finally, the user can use the cables 424 coming out of the dummy battery device 100 to connect the smartphone to at least a measurement device and a power supply.

It should be understood that different embodiments of the dummy battery device can be provided. For example, some battery connectors 24 are located on sidewall 18 and some other are located on sidewall 22. In that case, the socket 280 will be provided either on sidewalls 220 or 260 respectively.

Embodiments of the present invention allow to save cost, improve productivity and efficiency for smartphone power consumption testing. They do not require any soldering and thus are risk-free in terms of damages caused by manually soldering skills.

Also, batch production of the dummy battery device can be performed, thus minimizing test deviation caused by difference of electrical characteristics, such as resistance.

The above-described embodiments of the present invention are intended to be examples only. Alterations, modifications and variations may be effected to the particular embodiments by those of skill in the art without departing from the invention, which is defined solely by the claims appended hereto.

What is claimed is:

1. A dummy battery device for testing an electronic device having a battery cavity, the battery cavity comprising a connector therein, the dummy battery device comprising:
   a main structure shaped and dimensioned so as to fit in the battery cavity of the electronic device,
      wherein the main structure further comprises a main portion and an adjustable portion, the adjustable portion extending from one sidewall of the main portion, and
      wherein the adjustable portion comprises a bracket and springs attached thereto; and
   a head structure configured to be detachably and moveably connected to the main structure, the head structure having contacts for electrically contacting the connector of the battery cavity once the main structure is received in the battery cavity of the electronic device, and cables extending therefrom, the cables being electrically connected to the contacts of the head structure.

2. The dummy battery device of claim 1, wherein the adjustable portion is slidingly received into a chamber extending inwardly from the one sidewall of the main portion and the dummy battery device further comprises at least one spring located in the chamber.

3. The dummy battery device of claim 1, wherein the bracket and the springs are attached in a permanent manner.

4. The dummy battery device of claim 1, wherein the bracket and the springs are detachably attached to each other.

5. The dummy battery device of claim 1, wherein the bracket is u-shaped.

6. The dummy battery device of claim 2, wherein the springs are configured to push the adjustable portion outwardly to adjust a length of the dummy battery device so that the dummy battery device is held firmly in the battery cavity, once the dummy battery device is placed in the cavity.

7. The dummy battery device of claim 1, wherein the main structure is made of material selected from one of plastic, metal and composite material with a strong stiffness.

8. The dummy battery device of claim 1, wherein ends of the cables have connectors for connecting to measurement devices and a power supply device.

9. The dummy battery device of claim 1, wherein the main structure and the head structure have a complementary joint mechanism.

10. The dummy battery device of claim 9, wherein the main portion comprises a socket located on a first sidewall and the head structure comprises a projection extending from a bottom surface of the head structure, the projection entering the socket to provide for a dovetail joint mechanism.

11. The dummy battery device of claim 9, wherein the main portion comprises a projection located on a first sidewall and the head structure comprises a socket along a bottom surface of the head structure, the projection entering the socket to provide for a dovetail joint mechanism.

12. The dummy battery device of claim 10, wherein the projection slides along a length of the first sidewall on which the socket is located in order to adjust to different battery contact positions.

13. The dummy battery device of claim 10, wherein the projection comprises a magnet and wherein the socket is made of iron so that when the projection enters the socket, the head structure can be stopped at variable positions on the socket.

14. The dummy battery device of claim 10, wherein the projection comprises a probe which can be extended so as to create a friction force between the projection and the socket in order to stop the head structure at variable positions on the socket.

15. The dummy battery device of claim 1, wherein the head structure has the same number of contacts as the number of contacts defined on the connector of the cavity of the portable electronic device.

16. A method for testing an electronic device having a removable battery cavity which includes a connector therein, the method comprising:
 connecting a dummy battery device to the connector in the cavity, the dummy battery device comprising:
  a main structure shaped and dimensioned so as to fit in the battery cavity of the electronic device,
   wherein the main structure further comprises a main portion and an adjustable portion, the adjustable portion extending from one sidewall of the main portion, and
  wherein the adjustable portion comprises a bracket and springs attached thereto; and
  a head structure configured to be detachably and moveably connected to the main structure, the head structure having contacts for electrically connecting the connector of the battery cavity once the main structure is received in the battery cavity of the portable electronic device, and cables extending therefrom, the cables being electrically connected to the contacts of the head structure; and connecting the cables extending from the head structure to at least one of a measurement device and power supply.

* * * * *